(12) United States Patent
Parks et al.

(10) Patent No.: US 9,972,375 B2
(45) Date of Patent: May 15, 2018

(54) SANITIZE-AWARE DRAM CONTROLLER

(71) Applicant: VIA ALLIANCE SEMICONDUCTOR CO., LTD., Shanghai (CN)

(72) Inventors: Terry Parks, Austin, TX (US); Rodney E. Hooker, Austin, TX (US); Douglas R. Reed, Austin, TX (US)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 97 days.

(21) Appl. No.: 15/335,141

(22) Filed: Oct. 26, 2016

(65) Prior Publication Data

US 2017/0301386 A1  Oct. 19, 2017

Related U.S. Application Data

(60) Provisional application No. 62/323,177, filed on Apr. 15, 2016.

(51) Int. Cl.
*G06F 12/00* (2006.01)
*G11C 11/406* (2006.01)
(Continued)

(52) U.S. Cl.
CPC ............ *G11C 11/406* (2013.01); *G06F 3/064* (2013.01); *G06F 3/0619* (2013.01);
(Continued)

(58) Field of Classification Search
None
See application file for complete search history.

(56) References Cited

U.S. PATENT DOCUMENTS 5,469,559 A    11/1995  Parks et al.
5,524,248 A     6/1996  Parks et al.
(Continued)

FOREIGN PATENT DOCUMENTS

EP    2020659    2/2009

OTHER PUBLICATIONS

Bhati, Ishwar et al. "DRAM Refresh Mechanisms, Penalties, and Trade-Offs" IEEE Transactions on Computers, vol. 64, No. 1, Jan. 2015. pp. 1-14. Downloaded from https://www.ece.umd.edu/~blj/papers/ieeetc64-XX.pdf on Mar. 25, 2016.

*Primary Examiner* — John A Lane
(74) *Attorney, Agent, or Firm* — McClure, Qualey & Rodack, LLP

(57) ABSTRACT

A controller for controlling a dynamic random access memory (DRAM) comprising a plurality of blocks. A block is one or more units of storage in the DRAM for which the DRAM controller can selectively enable or disable refreshing. The DRAM controller includes flags each for association with a block of the blocks of the DRAM. A sanitize controller determines a block is to be sanitized and in response sets a flag associated with the block and disables refreshing the block. In response to subsequently receiving a request to read data from a location in the block, if the flag is clear, the DRAM controller reads the location and returns data read from it. If the flag is set, the DRAM controller refrains from reading the DRAM and returns a value of zero.

20 Claims, 4 Drawing Sheets

(51) Int. Cl.
*G11C 11/409* (2006.01)
*G06F 3/06* (2006.01)

(52) U.S. Cl.
CPC .......... *G06F 3/0659* (2013.01); *G06F 3/0673* (2013.01); *G11C 11/409* (2013.01)

(56) References Cited

U.S. PATENT DOCUMENTS

| | | |
|---|---|---|
| 7,292,490 B1 | 11/2007 | Shu et al. |
| 2006/0181949 A1 | 8/2006 | Kini |
| 2007/0180187 A1 | 8/2007 | Olson et al. |
| 2009/0027989 A1* | 1/2009 | Michalak ............... G11C 11/406 365/222 |
| 2009/0141575 A1 | 6/2009 | Kohler et al. |
| 2009/0172251 A1 | 7/2009 | Norman |
| 2011/0145271 A1 | 6/2011 | Noyes et al. |
| 2014/0032829 A1* | 1/2014 | Solihin ................ G11C 7/1072 711/105 |
| 2014/0068172 A1 | 3/2014 | Zheng et al. |
| 2014/0344513 A1 | 11/2014 | Lo et al. |
| 2016/0048451 A1* | 2/2016 | Solihin ............... G06F 12/0833 711/105 |

* cited by examiner

SANITIZE-AWARE DRAM CONTROLLER

CROSS REFERENCE TO RELATED APPLICATION(S)

This application claims priority based on U.S. Provisional Application Ser. No. 62/323,177, filed Apr. 15, 2016, entitled SANITIZE-AWARE DRAM CONTROLLER, which is hereby incorporated by reference in its entirety.

BACKGROUND

Dynamic random access memory (DRAM) is ubiquitous in modern computing systems. DRAM is ubiquitous because of its relatively low cost, high capacity/density and high speed. The density benefit largely derives from the fact that each cell for storing a data bit requires only a capacitor and single transistor. This is significantly less hardware than required per cell for a static random access memory (SRAM), for example. However, the storage of the data bit on the capacitor of the cell implies a power consumption cost. This is because the capacitor charge may leak over time, causing the cell to lose its value. Consequently, the capacitor must be "refreshed" periodically to retain its value. This involves reading the current value from the cell and writing it back to the cell to "refresh" its value. The refresh operation consumes additional power over other memory technologies that do not require refresh. Refresh may contribute to a significant percentage of the energy consumption of a DRAM, e.g., approximately 20%, and may degrade system performance, e.g., approximately 30%, depending upon the demand for DRAM access by the system.

U.S. Pat. No. 5,469,559, issued to one of the present co-inventors, describes a memory controller and method for refreshing a selected portion of a DRAM that does not contain valid data. This may reduce the amount of power consumed by refreshing, which is needless for invalid data.

The present inventors provide embodiments of a DRAM controller that provide further benefits. The additional benefits are enjoyed primarily by recognition by the inventors of the fact that many operating systems "sanitize" deallocated memory by writing zeroes to it in order to increase system security by preventing a hacker and/or the next user to whom the memory is allocated from seeing the data of the first user, for example.

DETAILED DESCRIPTION OF THE EMBODIMENTS

Glossary

A block of a DRAM is one or more units of storage in the DRAM for which the DRAM controller can selectively enable or disable refreshing. For example, what is commonly referred to as a "row" of a data RAM 122 is refreshable. For some DRAMs, a row is 512 bytes of storage, as an example.

To sanitize a block of DRAM means to clear all locations in the block to a zero value.

Figure 1:
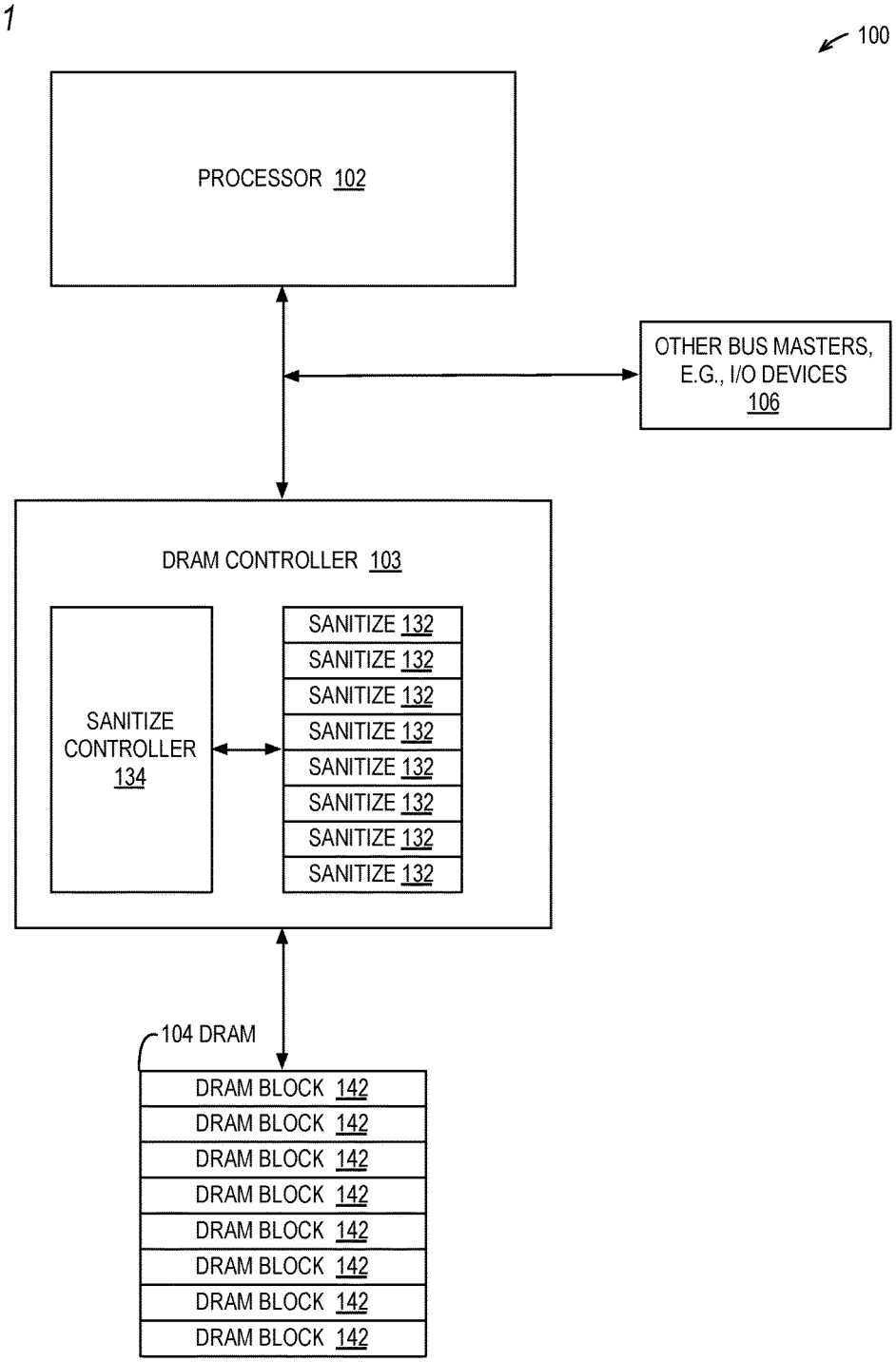
FIG. 1 is a block diagram illustrating a computing system.

Referring now to FIG. 1, a block diagram illustrating a computing system 100 is shown. The computing system 100 includes a processor 102, a DRAM 104, a DRAM controller 103 connecting the processor 102 to the DRAM 104, and other bus masters 106 that access the DRAM 104 via the DRAM controller 103, e.g., bus-mastering I/O devices. The processor 102 may be a multi-core processor. The processor 102 executes programs, including system software, such as an operating system and/or system firmware, such as Basic Input/Output System (BIOS) or extensible firmware, as well as utilities and application programs. The DRAM 104 is arranged as a plurality of DRAM blocks 142. The system software, among other things, sanitizes portions of the DRAM 104, including entire DRAM blocks 142. Many operating systems sanitize memory in the granularity of a page whose size is determined according to the virtual memory system supported by the processor 102. For example, common page sizes are 4 KB, 64 KB, 1 MB, 16 MB, 256 MB, 1 GB and 2 GB.

The DRAM controller 103 regards one or more units of storage in the DRAM 104 for which the DRAM controller can selectively enable or disable refreshing, for example, a row of the DRAM 104, as DRAM block 142. In some embodiments, the size of a DRAM block 142 corresponds to the size of the smallest pages supported by the processor's 102 virtual memory system. For example, if the unit of storage for which the DRAM controller can selectively enable or disable refreshing is a 512 byte row and the smallest page size supported by the processor 102 is 4 KB, then the DRAM controller 103 regards 8 contiguous rows of DRAM 104 as a DRAM block 142.

The DRAM controller 103 includes a plurality of sanitize flags 132, also referred to as sanitize bits 132, and a sanitize controller 134. In one embodiment, the DRAM controller 103 includes a sanitize bit 132 for each corresponding DRAM block 142 of the DRAM 104.

In an alternate embodiment, referred to herein as the sanitize range embodiment, each sanitize bit 132 has a corresponding range register which together comprise a sanitize pair. The range register holds an address and a count to specify a range of contiguous DRAM blocks 142. The address specifies the first, or starting, DRAM block 142 in the range, and the count specifies the number of contiguous DRAM blocks 142 in the range. If the sanitize bit 132 is set, then the range of DRAM blocks 142 specified in the corresponding range register is considered sanitized, as described in more detail below. The sanitize controller 134 treats the plurality of sanitize pairs as a pool from which the sanitize controller 134 can allocate for a range of contiguous DRAM blocks 142 (e.g., at block 304 of FIG. 3) and into which the DRAM controller 103 can deallocate (e.g., at block 508 of FIG. 5). If the sanitize bit 132 is set this indicates the sanitize pair is allocated, and if the sanitize bit 132 is clear this indicates the sanitize pair is free for allocation.

Figure 2:
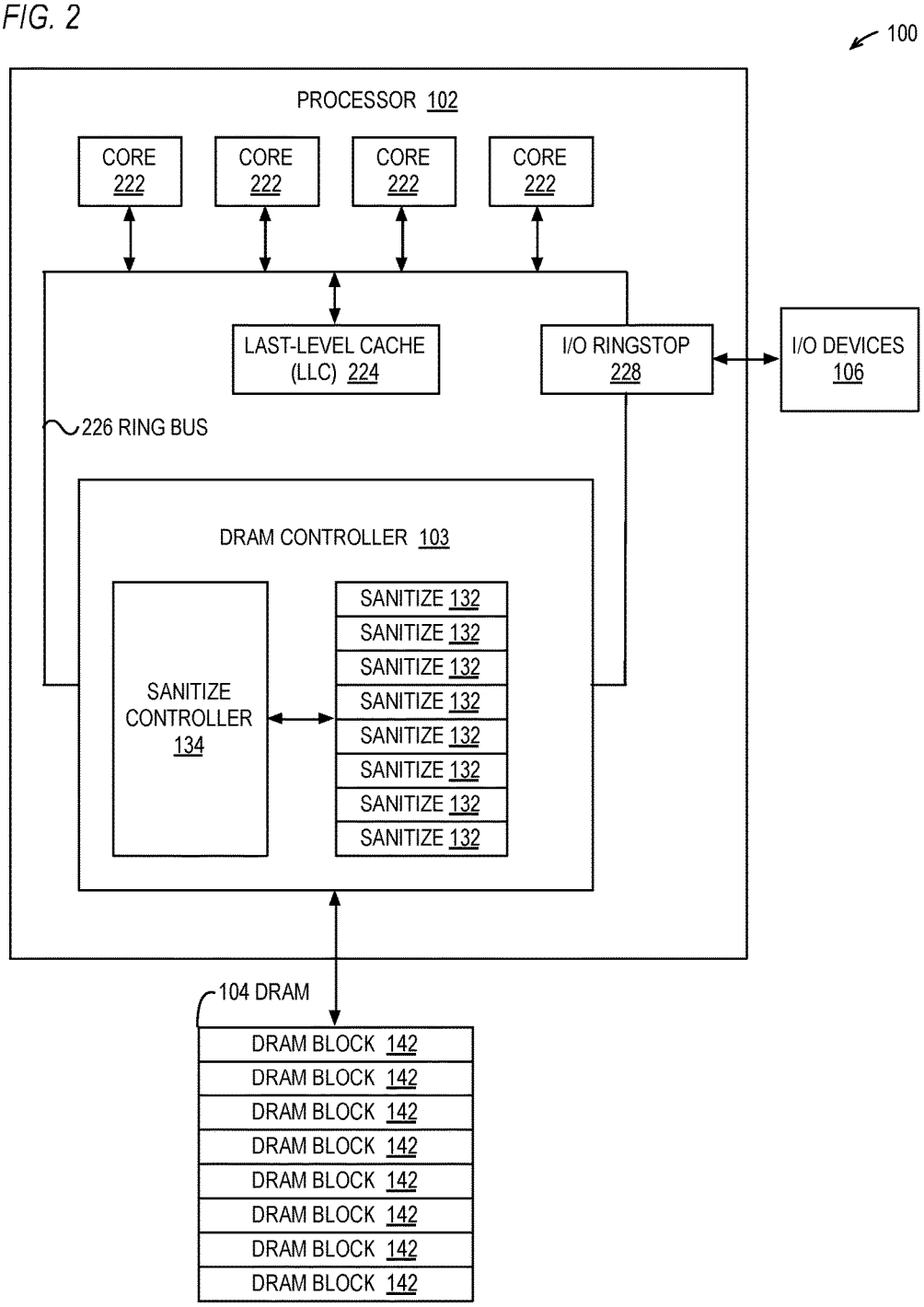
FIG. 2 is a block diagram illustrating a computing system according to an alternate embodiment.

Referring now to FIG. 2, a block diagram illustrating a computing system 100 according to an alternate embodiment is shown. The computing system 100 of FIG. 2 is similar to the computing system 100 of FIG. 1 and includes similar elements. However, in the computing system 100 of FIG. 2, the DRAM controller 103 is integrated into the processor 102. More specifically, the processor 102 includes a ring bus 226 to which the DRAM controller 103 is connected. The processor 102 also includes a plurality of processing cores 222 connected to the ring bus 226. The processor 102 also includes a last-level cache (LLC) 224 connected to the ring bus 226 which is shared by the cores 222. Preferably, the DRAM controller 103, LLC 224 and each core 222 has an associated ring stop that connects it to the ring bus 226. Finally, the processor 102 includes an I/O ring stop 228 that connects the I/O devices 106 to the ring bus 226.

Figure 3:
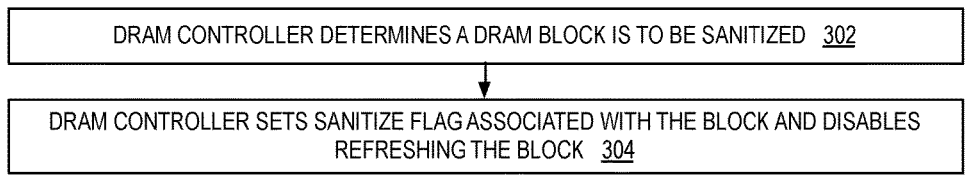
FIGS. 3 through 5 are flowcharts illustrating operation of the system.

Referring now to FIG. 3, a flowchart illustrating operation of the system 100 is shown. Flow begins at block 302.

At block 302, the DRAM controller 103 determines that a DRAM block 142 is to be sanitized. In one embodiment, the system software informs the DRAM controller 103 that a DRAM block 142 is to be sanitized, as described below with respect to FIG. 6, for example. In another embodiment, the DRAM controller 103 includes hardware that makes the determination by monitoring zero-valued writes to DRAM blocks 142, as described below with respect to FIGS. 7 and 8, for example. Other embodiments for determining that a DRAM block 142 is to be sanitized are also contemplated. Flow proceeds to block 304.

At block 304, the DRAM controller 103 sets the sanitize bit 132 associated with the DRAM block 142 determined at block 302. Additionally, the DRAM controller 103 disables refreshing of the DRAM block 142. In the sanitize range embodiment, the DRAM controller 103 allocates a sanitize pair, sets the sanitize bit 132, and populates the range register with the address of the first DRAM block 142 in the range and the count with the number of DRAM blocks 142 in the range. Additionally, the DRAM controller 103 disables refreshing of all the DRAM blocks 142 in the range. Flow ends at block 304.

Figure 4:
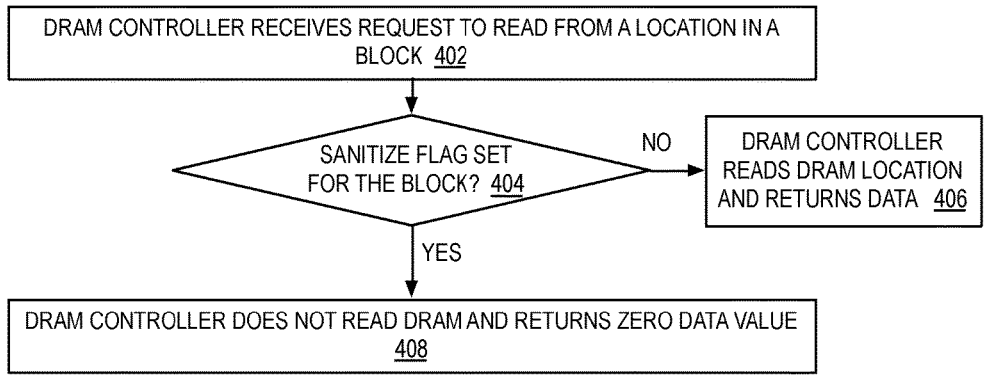

Referring now to FIG. 4, a flowchart illustrating operation of the system 100 is shown. Flow begins at block 402.

At block 402, the DRAM controller 103 receives a request to read from a location of the DRAM 104. The location implicates a DRAM block 142, i.e., is within a DRAM block 142 based on its address. Flow proceeds to decision block 404.

At decision block 404, the DRAM controller 103 determines whether the sanitize bit 132 corresponding to the implicated DRAM block 142 is set. If so, flow proceeds to block 408; otherwise, flow proceeds to block 406. In the sanitize range embodiment, the sanitize controller 134 determines that the address of the read request falls into the range specified in the range register of a sanitize pair whose sanitize bit 132 is set.

At block 406, the DRAM controller 103 reads the specified location from the DRAM 104 and returns the data that was read, i.e., according to normal operation of the DRAM controller 103. Flow ends at block 406.

At block 408, the DRAM controller 103 does not read the DRAM 104 and instead returns a zero value to the read request. This is because the DRAM block 142 implicated by the read request was determined to be sanitized at decision block 404. Flow ends at block 408.

Advantages of not reading the DRAM when the block is sanitized (e.g., at block 408) are: (1) less power may be consumed because the DRAM block need not be refreshed to maintain a zero value; (2) less power may be consumed because the DRAM is not accessed to read the data, even though software requested to read the data; and (3) performance may be improved because the latency of the read request is shorter because the DRAM does not have to be accessed to read the requested data, all of which is possible because the desired value of the data is known to be zero.

Figure 5:
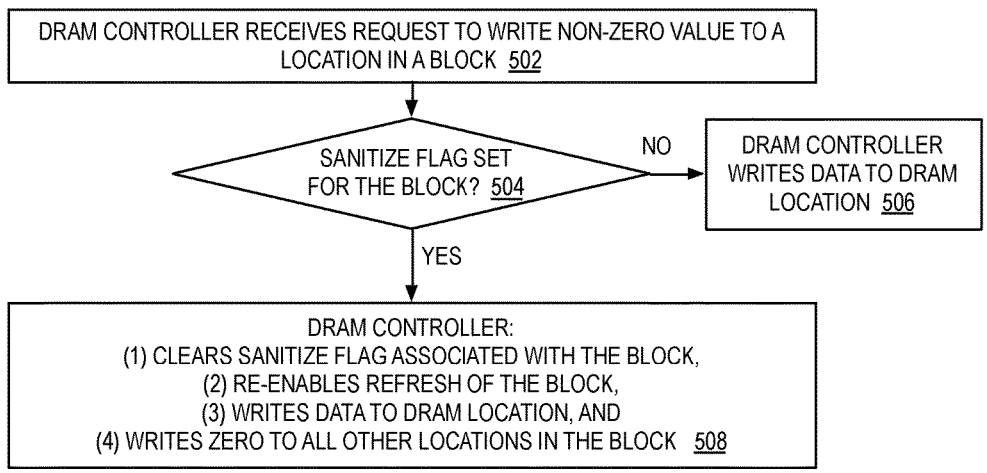

Referring now to FIG. 5, a flowchart illustrating operation of the system 100 is shown. Flow begins at block 502.

At block 502, the DRAM controller 103 receives a request to write data to a location of the DRAM 104. More specifically, the DRAM controller 103 determines that the data to be written has a non-zero value. The location implicates a DRAM block 142, i.e., is within a DRAM block 142 based on its address, or implicates a range of DRAM blocks 142 in the sanitize range embodiment. In an alternate embodiment, the DRAM controller 103 does not check to see whether the data to be written is non-zero, but instead performs the operations of FIG. 5 regardless of the data value. If the DRAM controller 103 receives a request to write data to a location of the DRAM 104 that has a zero value, then if the sanitize bit 132 is set the DRAM controller 103 does not write to the DRAM 104, whereas if the sanitize bit 132 is clear the DRAM controller 103 writes the zero value to the specified location of the DRAM 104. Flow proceeds to decision block 504.

At decision block 504, the DRAM controller 103 determines whether the sanitize bit 132 corresponding to the implicated DRAM block 142 or range of DRAM blocks 142 is set. If so, flow proceeds to block 508; otherwise, flow proceeds to block 506. In the sanitize range embodiment, the sanitize controller 134 determines that the address of the write request falls into the range specified in the range register of a sanitize pair whose sanitize bit 132 is set.

At block 506, the DRAM controller 103 writes the specified data to the specified location of the DRAM 104, i.e., according to normal operation of the DRAM controller 103. Flow ends at block 506.

At block 508, the DRAM controller 103 clears the sanitize bit 132 corresponding to the implicated DRAM block 142. Additionally, the DRAM controller 103 re-enables refreshing for the implicated DRAM block 142 or the range of DRAM blocks 142 implicated by the range register in the sanitize range embodiment. Still further, the DRAM controller 103 writes the specified data to the specified location of the DRAM 104. Finally, the DRAM controller 103 writes zeroes to all the locations of the DRAM block 142 or implicated range of DRAM blocks 142 other than the location specified by the write request. Flow ends at block 508.

Advantages of waiting to write the other locations of the block to zero values until the first non-zero write to the sanitized block are: (1) less power may be consumed because the DRAM block is not being refreshed for an additional amount of time than it would be if refreshing was begun as soon as the operating system indicated the block was allocated (e.g., as in U.S. Pat. No. 5,469,559), and in some cases it may be a significant amount of time before software writes to the block after it allocates the block; and (2) the operating system does not have to perform all the writes of zero to the block, which involves the processor 102 executing instructions, which may be on the order of tens to hundreds, to write the zeroes to the block. This latter consideration has the resulting benefits of: (a) less power may be consumed by the processor 102 because it does not have to execute the many write instructions; (b) system performance may be improved because the processor 102 does not have to execute the many write instructions and is therefore free to execute other instructions; and (c) system performance may be improved because the DRAM controller 103 performs the zero writes to the block without the extra latency that would be involved if the processor 102 had to execute the write instructions and then make the write requests to the DRAM controller 103. It should be understood that the second benefit (2) may not be realized by the sanitize detection hardware (SDH) embodiment of FIGS. 7 and 8.

Figure 6:
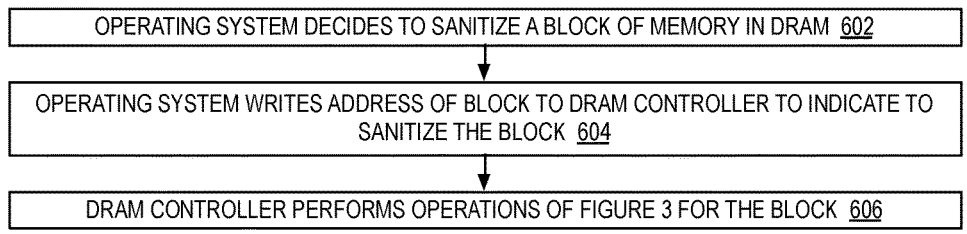
FIG. 6 is a flowchart illustrating operation of the system to perform selective refresh of sanitized DRAM blocks according to one embodiment.

Referring now to FIG. 6, a flowchart illustrating operation of the system 100 to perform selective refresh of sanitized DRAM blocks 142 according to one embodiment is shown. Flow begins at block 602.

At block 602, system software (e.g., the operating system or other executive) decides to sanitize a DRAM block 142. For example, some operating systems provide system calls, such as bzero( ) and memset( ) found in the UNIX operating system and related operating systems such as Mac OS X and later versions of Microsoft Windows, that can be invoked to sanitize a sequence of memory locations, i.e., a specified number of contiguous memory locations beginning at a specified memory address. Conventionally, the routines that implement these system calls perform a series of writes of the value zero to all the memory locations in the specified sequence. In one embodiment, the routine that implements the system call is modified take advantage of the capabilities of the DRAM controller 103. More specifically, the routine checks to see whether one or more entire DRAM blocks 142 are included by the sequence of memory locations. If so, instead of conventionally performing the series of zero-valued writes to the included blocks 142, the routine writes to the DRAM controller 103 to request it to sanitize the included blocks 142, as described with respect to block 604. Flow proceeds to block 604.

At block 604, the system software writes the address of the block 142 to be sanitized to the DRAM controller 103. Preferably, the DRAM controller 103 includes a control register that receives the address. That is, the control register is writeable by system software running on the system 100 (e.g., on the processor 102) that includes the DRAM 104 and DRAM controller 103. In the sanitize range embodiment, the system software writes both the address and the count of DRAM blocks 142 of the range. Flow proceeds to block 606.

At block 606, the DRAM controller 103 performs the operations of FIG. 3 for the specified block 142 or range of blocks 142, namely setting the sanitize bit 132 associated with the block 142 or range of blocks 142 and disabling refresh for the block 142 or range of blocks 142. Flow ends at block 606.

Figure 7:
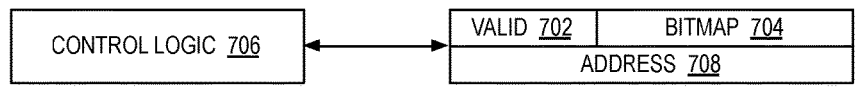
FIG. 7 is a block diagram illustrating a sanitize detection hardware (SDH) instance.

Referring now to FIG. 7, a block diagram illustrating a sanitize detection hardware (SDH) instance 700 is shown. In one embodiment, the DRAM controller 103 includes a plurality of SDH instance 700 from which the DRAM controller 103 allocates (e.g., at block 806 of FIG. 8) and into which the DRAM controller 103 deallocates (e.g., at block 818 of FIG. 8). The SDH instance 700 includes a valid bit 702, a bitmap 704, an address register 708, and control logic 706. The valid bit 702 indicates the SDH instance 700 is allocated if true and indicates the SDH instance 700 is free if false. The bitmap 704 includes a bit for each location of the DRAM block 142 whose address is held in the address register 708. In various embodiments, a location in the DRAM block 142 corresponds to an aligned byte, a 16-bit half-word, a 32-bit word, a 64-bit double-word, a 128-bit quad-word, or a 256-bit octa-word. In one embodiment, a location corresponds to an aligned cache line, e.g., of a last-level cache of the processor 102. The control logic 706 performs operations associated with reading and updating the valid bit 702, bitmap 704 and address register 708, such as those described below with respect to FIG. 8.

Figure 8:
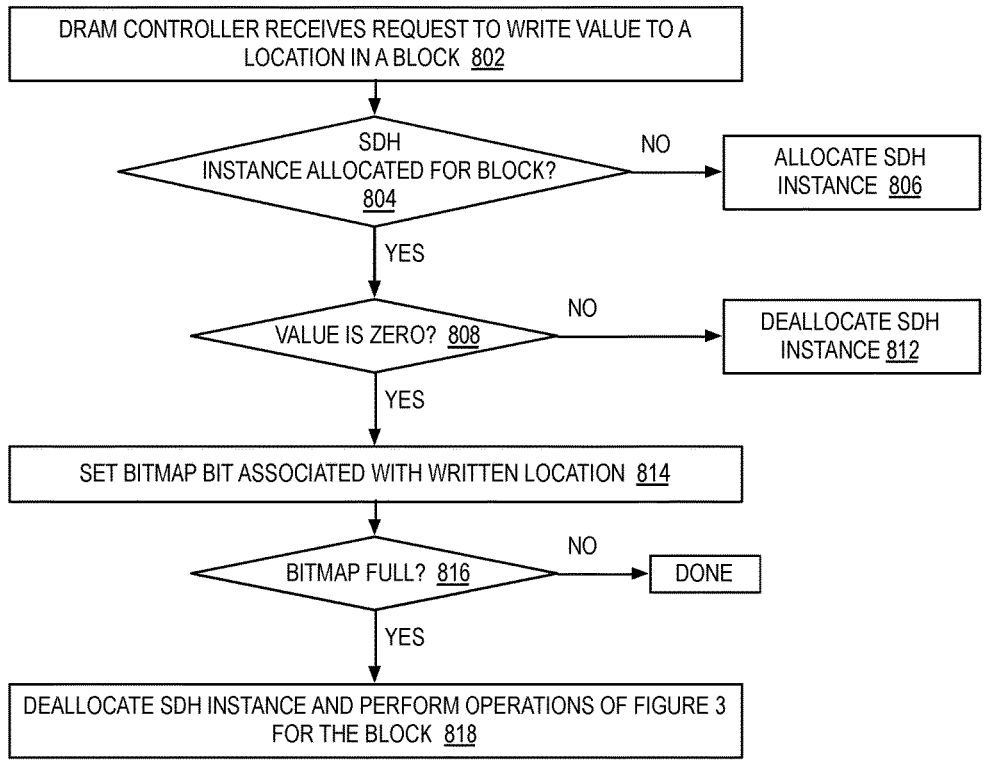
FIG. 8 is a flowchart illustrating operation of the DRAM controller to detect that a DRAM block is to be sanitized by employing the SDH instances of FIG. 7.

Referring now to FIG. 8, a flowchart illustrating operation of the DRAM controller 103 to detect that a DRAM block 142 is to be sanitized by employing the SDH instances 700 of FIG. 7 is shown. Flow begins at block 802.

At block 802, the DRAM controller 103 receives a request to write data to a location of the DRAM 104. The location implicates a DRAM block 142, i.e., is within a DRAM block 142 based on its address, or implicates a range of DRAM blocks 142 in the sanitize range embodiment. Flow proceeds to decision block 804.

At decision block 804, the DRAM controller 103 determines whether a SDH instance 700 has been allocated for the DRAM block 142 or range of DRAM blocks 142 implicated by the write request. More specifically, the DRAM controller 103 determines whether the relevant portion of the read request address matches the address 708 of a valid 702 SDH instance 700. If so, flow proceeds to decision block 808; otherwise, flow proceeds to block 806.

At block 806, the sanitize controller 134 allocates a free SDH instance 700. Preferably, allocating the SDH instance 700 includes finding a free SDH instance 700 (i.e., whose valid bit 702 is false), initializing the valid bit to true, clearing all bits of the bitmap 704 to zero, and writing the relevant portion of the write request address into the address register 708. Preferably, if there is no free SDH 700 to allocate, the DRAM controller 103 simply continues normally, i.e., it does not attempt to detect that a block 142 is being sanitized. Flow ends at block 806.

At decision block 808, the sanitize controller 134 determines whether the value to be written is zero. If so, flow proceeds to block 814; otherwise, flow proceeds to block 812.

At block 812, the sanitize controller 134 deallocates the SDH instance 700 that was previously allocated for the DRAM block 142 (i.e., at block 806). Preferably, deallocating the SDH instance 700 comprises clearing the valid bit 702, which frees the SDH instance 700 for subsequent allocation. Flow ends at block 812.

At block 814, the sanitize controller 134 sets the bitmap 704 bit associated with the location in the DRAM block 142 written by the request received at block 802. Flow proceeds to decision block 816.

At decision block 816, the sanitize controller 134 determines whether the bitmap 704 is full, i.e., whether the bitmap 704 has all of its bits set. If so, flow proceeds to block 818; otherwise, flow ends.

At block 818, the sanitize controller 134 deallocates the SDH instance 700 that was previously allocated for the DRAM block 142 and begins to perform the operations for the DRAM block 142 as described with respect to FIG. 3 because the sanitize controller 134 has determined that the system software has sanitized the DRAM block 142.

Other embodiments of an SDH instance are contemplated. In one embodiment, the DRAM controller 103 assumes the series of zero-valued writes to sanitize the block 142 are of fixed size words and begin at the first location in the block 142. The embodiment does not require the bitmap 704, but instead requires a register that holds the index of the fixed-size word within the block 142 after the word of the block 142 most recently written with a zero value. During operation, the DRAM controller 103 detects a write of a data value to the first location in a block 142. If no SDH instance has been allocated for the block 142 and the write is of a zero-valued word of the fixed-size, the DRAM controller 103 allocates an SDH instance. Allocating the SDH instance includes initializing the register to a value of one. If an SDH instance has been allocated for the block 142, the DRAM controller 103 determines whether the data value is zero and the index of the register matches the index of the current zero-valued write. If not, the DRAM controller 103 deallocates the SDH instance. Otherwise, the DRAM controller 103 determines whether the index of the register is the highest index in the block 142. If so, the DRAM controller 103 deallocates the SDH instance and performs the operations of FIG. 3 for the block; otherwise, the DRAM controller 103 increments the register.

While various embodiments of the present invention have been described herein, it should be understood that they have been presented by way of example, and not limitation. It will be apparent to persons skilled in the relevant computer arts that various changes in form and detail can be made therein without departing from the scope of the invention. For example, software can enable, for example, the function, fabrication, modeling, simulation, description and/or testing of the apparatus and methods described herein. This can be accomplished through the use of general programming languages (e.g., C, C++), hardware description languages (HDL) including Verilog HDL, VHDL, and so on, or other available programs. Such software can be disposed in any known computer usable medium such as magnetic tape, semiconductor, magnetic disk, or optical disc (e.g., CD-ROM, DVD-ROM, etc.), a network, wire line, wireless or other communications medium. Embodiments of the apparatus and method described herein may be included in a semiconductor intellectual property core, such as a processor core (e.g., embodied, or specified, in a HDL) and transformed to hardware in the production of integrated circuits. Additionally, the apparatus and methods described herein may be embodied as a combination of hardware and software. Thus, the present invention should not be limited by any of the exemplary embodiments described herein, but should be defined only in accordance with the following claims and their equivalents. Specifically, the present invention may be implemented within a processor device that may be used in a general-purpose computer. Finally, those skilled in the art should appreciate that they can readily use the disclosed conception and specific embodiments as a basis for designing or modifying other structures for carrying out the same purposes of the present invention without departing from the scope of the invention as defined by the appended claims.

The invention claimed is:

1. A controller for controlling a dynamic random access memory (DRAM) comprising a plurality of blocks, a block is one or more units of storage in the DRAM for which the DRAM controller can selectively enable or disable refreshing, the DRAM controller comprising:
 a plurality of flags each for association with a block of the plurality of blocks of the DRAM; and
 a sanitize controller that determines that a block of the plurality of blocks is to be sanitized and in response sets a flag of the plurality of flags associated with a block of the plurality of blocks and disables refreshing the block; and
 in response to subsequently receiving a request to read data from a location in the block:
  if the flag is clear, the DRAM controller reads the location and returns data read therefrom; and
  if the flag is set, the DRAM controller returns a value of zero and refrains from reading the DRAM.

2. The DRAM controller of claim 1, further comprising:
 in response to subsequently receiving a request to write data to a location in the block:
  (a) if the flag is clear, the DRAM controller writes the data to the location; and
  (b) if the flag is set, the DRAM controller:
   enables refreshing the block; and
   writes the data to the location.

3. The DRAM controller of claim 2, further comprising:
 in response to subsequently receiving the request to write data to the location in the block:
  (b) if the flag is set, the DRAM controller further:
   clears the flag; and
   writes a value of zero to all other locations in the block.

4. The DRAM controller of claim 2, further comprising:
 in response to subsequently receiving the request to write data to the location in the block:
  if the flag is set, the DRAM controller performs operations (a) and (b) only if the data to be written is non-zero.

5. The DRAM controller of claim 1, further comprising:
 a control register; and
 the sanitize controller determines that the block is to be sanitized by detecting a write to the control register by system software of a system that comprises the DRAM and DRAM controller.

6. The DRAM controller of claim 1, further comprising:
 the sanitize controller includes hardware that determines that the block is to be sanitized by detecting a series of zero-valued writes, without an intervening non-zero-valued write to any location of the block, to all locations of the block.

7. The DRAM controller of claim 6, the hardware comprises:
 a plurality of sanitize detection hardware instances that are separately allocatable by the sanitize controller for different blocks of the plurality of blocks of the DRAM.

8. The DRAM controller of claim 7, each sanitize detection hardware instance comprises:
 a bitmap that the DRAM controller uses to keep track of which locations within the block have been written with zero values; and
 logic that detects when the bitmap has all true bits.

9. The DRAM controller of claim 7, each sanitize detection hardware instance comprises:
 a register that holds an index of a next fixed-size word after a fixed-size word in the block most recently written with a zero value, the register is incremented upon a match of the index with an index of a current zero-valued fixed-size word write; and
 logic that detects when the index of the current zero-valued fixed-size word write is a highest index in the block.

10. A method for controlling a dynamic random access memory (DRAM) comprising a plurality of blocks, a block is one or more units of storage in the DRAM for which the DRAM controller can selectively enable or disable refreshing, the method comprising:
 determining that a block of the plurality of blocks is to be sanitized and in response sets a flag associated with a block of the plurality of blocks and disables refreshing the block;

the flag is a flag of a plurality of flags each for association with a block of the plurality of blocks of the DRAM; and in response to subsequently receiving a request to read data from a location in the block:
- if the flag is clear, reading the location and returning data read therefrom; and
- if the flag is set, returning a value of zero and refraining from reading the DRAM.

11. The method of claim 10, further comprising:

in response to subsequently receiving a request to write data to a location in the block:
- (a) if the flag is clear, writing the data to the location; and
- (b) if the flag is set,:
  - enabling refreshing the block; and
  - writing the data to the location.

12. The method of claim 11, further comprising:

in response to subsequently receiving the request to write data to the location in the block:
- (b) if the flag is set, further:
  - clearing the flag; and
  - writing a value of zero to all other locations in the block.

13. The method of claim 11, further comprising:

in response to subsequently receiving the request to write data to the location in the block:
- if the flag is set, performing operations (a) and (b) only if the data to be written is non-zero.

14. The method of claim 10, further comprising:

said determining that the block is to be sanitized comprises detecting a write to a control register by system software of a system that comprises the DRAM and a DRAM controller that includes the control register.

15. The method of claim 10, further comprising:

said determining that the block is to be sanitized comprises detecting a series of zero-valued writes, without an intervening non-zero-valued write to any location of the block, to all locations of the block.

16. The method of claim 15, further comprising:

the method is performed by a DRAM controller that includes a plurality of sanitize detection hardware instances that are separately allocatable for different blocks of the plurality of blocks of the DRAM.

17. The method of claim 16, further comprising:

setting to true a bit of a bitmap in response to detecting a write of a zero value to a location within the block, each bit of the bitmap is associated with a different location within the block; and said determining that the block is to be sanitized comprises detecting that the bitmap has all true bits.

18. The method of claim 16, further comprising:

maintaining a register to hold an index of a next fixed-size word after a fixed-size word in the block most recently written with a zero value by incrementing the register upon a match of the index with an index of a current zero-valued fixed-size word write; and said determining that the block is to be sanitized comprises detecting when the index of the current zero-valued fixed-size word write is a highest index in the block.

19. A computer program product encoded in at least one non-transitory computer usable medium for use with a computing device, the computer program product comprising:

computer usable program code embodied in said medium, for specifying a controller for controlling a dynamic random access memory (DRAM) comprising a plurality of blocks, a block is one or more units of storage in the DRAM for which the DRAM controller can selectively enable or disable refreshing, the computer usable program code comprising:
- first program code for specifying a plurality of flags each for association with a block of the plurality of blocks of the DRAM; and
- second program code for specifying a sanitize controller that determines that a block of the plurality of blocks is to be sanitized and in response sets a flag of the plurality of flags associated with a block of the plurality of blocks and disables refreshing the block; and in response to subsequently receiving a request to read data from a location in the block:
- if the flag is clear, the DRAM controller reads the location and returns data read therefrom; and
- if the flag is set, the DRAM controller refrains from reading the DRAM and returns a value of zero.

20. The computer program product of claim 19, wherein the at least one non-transitory computer usable medium is selected from the set of a disk, tape, or other magnetic, optical, or electronic storage medium.

* * * * *